United States Patent
Kim et al.

(10) Patent No.: US 7,064,026 B2
(45) Date of Patent: Jun. 20, 2006

(54) SEMICONDUCTOR DEVICE HAVING SHARED CONTACT AND FABRICATION METHOD THEREOF

(75) Inventors: Do-Hyung Kim, Seoul (KR); Jung-In Hong, Kyunggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 11/143,194

(22) Filed: Jun. 1, 2005

(65) Prior Publication Data

US 2005/0208725 A1 Sep. 22, 2005

Related U.S. Application Data

(62) Division of application No. 10/112,413, filed on Mar. 29, 2002, now Pat. No. 6,927,461.

(30) Foreign Application Priority Data

Jun. 22, 2001 (KR) ............... 2001-35703

(51) Int. Cl.
*H01L 21/8238* (2006.01)

(52) U.S. Cl. .............. 438/230; 438/231; 438/232; 438/290; 438/303

(58) Field of Classification Search ........ 438/230–233, 438/290, 299, 303, 305
See application file for complete search history.

(56) References Cited

U.S. PATENT DOCUMENTS

| | | | |
|---|---|---|---|
| 4,636,834 A | 1/1987 | Shepard | |
| 4,729,002 A | 3/1988 | Yamazaki | |
| 5,015,598 A | 5/1991 | Verhaar | |
| 5,473,184 A | 12/1995 | Murai | |
| 5,621,232 A | 4/1997 | Ohno | |
| 5,817,562 A | 10/1998 | Chang et al. | |
| 5,824,579 A | 10/1998 | Subramanian et al. | |
| 5,920,780 A | 7/1999 | Wu | |
| 5,930,627 A | 7/1999 | Zhou et al. | |
| 6,013,569 A | 1/2000 | Lur et al. | |
| 6,015,741 A | 1/2000 | Lin et al. | |
| 6,100,569 A | 8/2000 | Yeh | |
| 6,194,261 B1 | 2/2001 | Imai | |
| 6,238,988 B1 | 5/2001 | Hsiao et al. | |
| 6,245,621 B1 | 6/2001 | Hirohama | |
| 6,258,678 B1 | 7/2001 | Liaw | |
| 6,335,279 B1 | 1/2002 | Jung et al. | |
| 6,455,362 B1 | 9/2002 | Tran et al. | |
| 6,468,919 B1 | 10/2002 | Chien et al. | |

(Continued)

*Primary Examiner*—Hsien-Ming Lee
(74) *Attorney, Agent, or Firm*—Marger Johnson & McCollom, P.C (57) ABSTRACT

Semiconductor devices and methods of fabrication. A device includes a semiconductor substrate, a gate electrode insulated from the semiconductor substrate by a gate insulation layer, LDD-type source/drain regions formed at both sides of the gate electrode, an interlayer insulation layer formed over the gate electrode and the substrate, and a shared contact piercing the interlayer insulation layer and contacting the gate electrode and one of the LDD-type source/drain regions including at least a part of a lightly doped drain region. Multiple-layer spacers are formed on both sides of the gate structure and used as a mask in forming the LDD-type regions. At least one layer of the spacer is removed in the contact opening to widen the opening to receive a contact plug.

6 Claims, 7 Drawing Sheets

U.S. PATENT DOCUMENTS

| | | |
|---|---|---|
| 6,512,299 B1 | 1/2003 | Noda |
| 6,534,351 B1 | 3/2003 | Muller et al. |
| 6,534,389 B1 | 3/2003 | Ference et al. |
| 6,593,632 B1 | 7/2003 | Avanzino et al. |
| 6,635,966 B1 * | 10/2003 | Kim ............................ 257/758 |
| 6,710,413 B1 | 3/2004 | Thei et al. |
| 2002/0086486 A1 | 7/2002 | Tanaka et al. |
| 2004/0155269 A1 | 8/2004 | Yelehanka et al. |

* cited by examiner

(Prior Art)

Fig. 3

(Prior Art)

Fig. 4

(Prior Art)

SEMICONDUCTOR DEVICE HAVING SHARED CONTACT AND FABRICATION METHOD THEREOF

CROSS REFERENCE TO RELATED APPLICATIONS

This application is a Divisional of U.S. patent Ser. No. 10/112,413, filed on Mar. 29, 2002, now U.S. Pat. No. 6,927,461 which claims priority from Korean Patent Application No. 2001-35703, filed on Jun. 22, 2001, the contents of which are herein incorporated by reference in their entirety.

FIELD OF THE INVENTION

The present invention relates to a semiconductor device and a method of fabricating the same. More particularly, the present invention relates to a semiconductor device having a shared contact that may decrease contact resistance and to a method of fabricating the same.

BACKGROUND OF THE INVENTION

As semiconductor devices become highly integrated, a MOS transistor begins to have a source/drain region of shallow junction. In order to increase reliability of the MOS transistor, a technique of forming LDD-type source/drain regions has been widely used. A gate spacer is formed at the sidewall of a gate electrode to form a LDD-type source/drain region. A silicon nitride layer having etch selectivity with a silicon oxide layer composing an interlayer insulation layer may be used to form a self-aligned contact suitable for a highly integrated semiconductor device as a conventional material layer to form a gate spacer.

To organize a circuit of a SRAM or non-memory semiconductor device, a gate electrode of one transistor may be directly connected with a source/drain region of another transistor. If the gate electrode and the source/drain region are closely arranged, a shared contact is formed for electrical connection instead of separate contacts.

Figure 1:
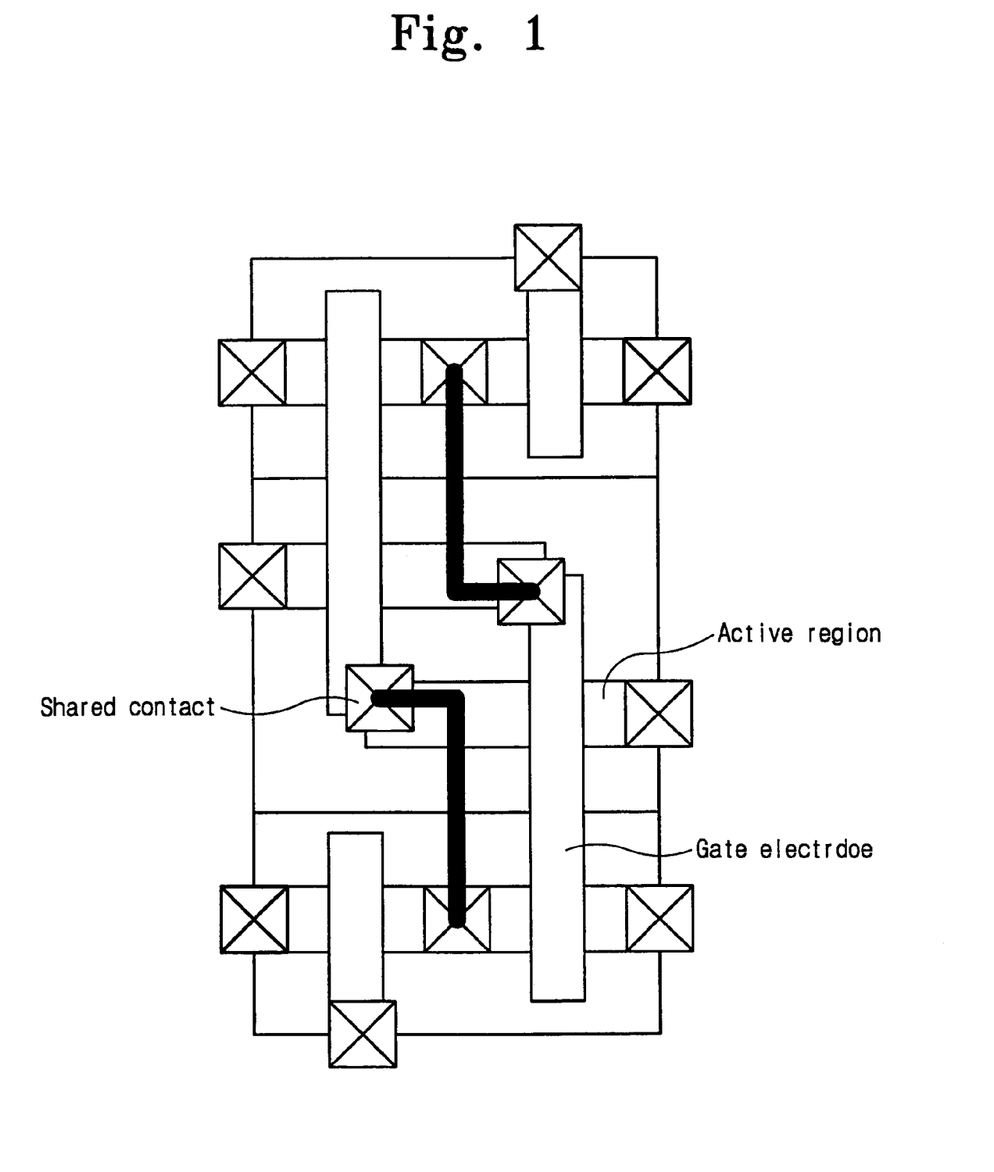
FIG. 1 is a layout of an SRAM cell in which a gate electrode is electrically connected with a source/drain region through a shared contact and in which the present invention may be implemented.

FIG. 1 is an example of a layout of the SRAM cell using shared contacts.

Figure 2:
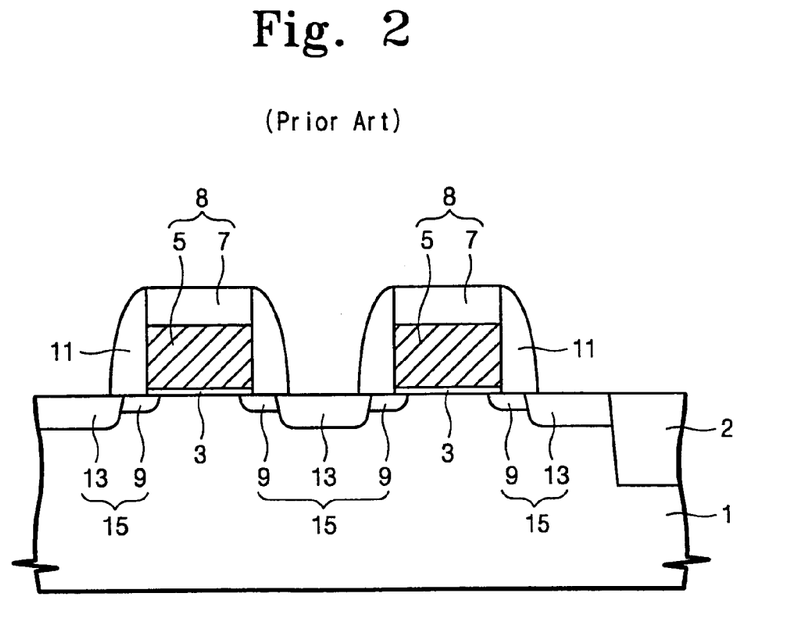
FIGS. 2 through 4 illustrate successive cross-sectional views explaining a method of forming an LDD-type semiconductor device using a conventional shared contact in the prior art.
Figure 3:
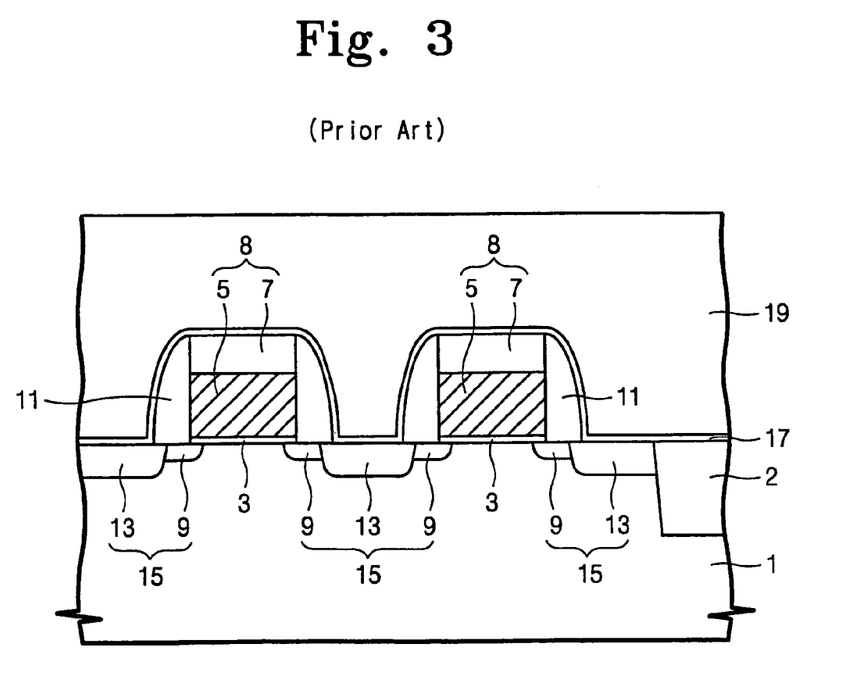
Figure 4:
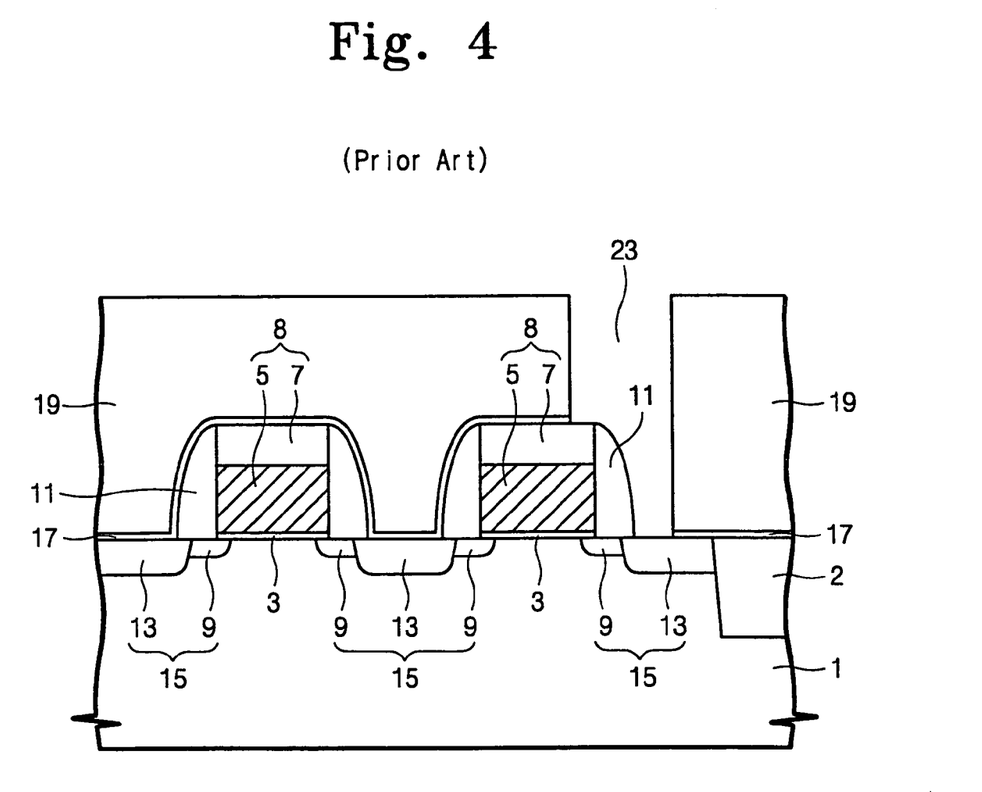

FIGS. 2 through 4 illustrate cross-sectional views displaying a method of forming an LDD-type semiconductor device using a conventional shared contact.

Referring to FIG. 2, an isolation layer 2 is formed in a desired region of a semiconductor substrate 1 to isolate an active region. A gate insulation layer 3 is formed on the active region, and then a polysilicon layer 5 and a metal silicide layer 7 are sequentially stacked over the entire surface of the semiconductor substrate, including the gate insulation layer 3, thereby forming a gate electrode layer. The gate electrode layer is then patterned to form a couple of gate patterns 8 crossing a top part of a desired region of the gate insulation layer 3. Because the gate insulation layer 3 may be over-etched, the active region of both sides of the gate pattern 8 may be exposed.

Impurity ions are implanted in the active region in a dose amount of $1 \times 10^{12}$ to $1 \times 10^{13}$ atoms/cm$^2$ by using the gate pattern 8 as an ion-implantation mask. A low-concentration source/drain region 9 is formed in the active region located on both sides of each gate pattern 8. Next, a gate spacer 11 of silicon nitride is formed on the sidewall of the gate pattern 8. Impurity ions are implanted in the low-concentration source/drain region 9 in a dose amount of $1 \times 10^{15}$ to $5 \times 10^{15}$ atoms/cm$^2$ using the gate spacer 11 and the gate patterns 8 as ion-implantation masks. Thus, a high-concentration source/drain region 13 is formed, which has a higher impurity concentration than the low-concentration source/drain region 9. The low-concentration source/drain region 9 and the high-concentration source/drain region 13 compose LDD-type source/drain regions 15.

Referring to FIG. 3, oxide layer etching is performed with respect to the resultant structure, thereby exposing a silicon surface where the LDD-type source/drain regions 15 are formed. An etch-stopping layer 17 is formed over the entire surface. The etch-stopping layer 17 is made of a material layer having an etch selectivity with respect to silicon oxide. An interlayer insulation layer 19 is formed over the entire surface of the semiconductor substrate, including the etch-stopping layer 17.

Referring to FIG. 4, the interlayer insulation layer 19 and the etch-stopping layer 17 are continuously patterned to form a contact hole 23 which exposes the metal silicide layer 7 in the gate pattern 8 and the neighboring source/drain region 13.

Contact hole 23 will be filled with a metal to form a contact plug. It is therefore desired to maximize that portion of the surface area of the LDD-type source/drain regions 15 exposed by the contact hole. But the presence of gate spacer 11 limits the exposable area. A further problem arises from possible misalignment during a photo-lithography process. The contact hole 23 can be offset, which further reduces that portion of the surface area of the LDD-type source/drain regions 15 exposed by the contact hole 23. In the worst case scenario, the source/drain region is not revealed at the bottom of the contact hole 23.

When contact area is reduced, the contact resistance increases, interfering with normal operation of a device. This may result in degradation of the performance of the semiconductor device, or it may induce operation failure.

Additionally, as the width of the exposed surface of the source/drain region becomes smaller than the height of the gate pattern in the contact hole, the aspect ratio increases. This increases the difficulty of filling the contact hole with a barrier metal layer and a plug metal layer. This may result in formation of a void at the contact location on the source/drain region, thereby causing an operation failure and degrading reliability in a semiconductor device.

Conversely, using a conventional technique in which spacer thickness is reduced to increase contact exposure to the source/drain region, results in restricting the length of the lightly doped drain region which may result in degradation of transistor performance.

SUMMARY OF THE INVENTION

The present invention provides a semiconductor device which includes a semiconductor substrate, a gate electrode insulated from the semiconductor substrate by a gate insulation layer, LDD-type source/drain regions formed at both sides of the gate electrode, and an interlayer insulation layer formed over the gate electrode and the substrate. A shared contact pierces the interlayer insulation layer and contacts the gate electrode and one of the LDD-type source/drain regions. The contact between the shared contact and the LDD-type source/drain regions includes at least a portion of a lightly doped drain region.

The present invention additionally provides a method of forming a semiconductor device. A gate pattern is formed on a substrate. A low-concentration source/drain region is formed at a location in the substrate located at both sides of the gate pattern through ion-implantation. A spacer is formed, having an etch selectivity with respect to the gate pattern at the sidewall of the gate pattern. Ion-implantation is performed by using the gate pattern and the spacer as ion-implantation masks to form a high-concentration impurity ion-implantation region. An interlayer insulation layer is formed over the gate pattern at whose sidewall the spacer is formed. A shared contact hole is formed exposing parts of the top surface of the gate pattern and the LDD-type source/drain regions of the substrate adjacent to the gate pattern, and simultaneously etching and removing a certain width of the spacer together with the interlayer insulation layer at the shared contact region.

An advantage of the present invention is that it provides a semiconductor device that secures a sufficient contact region, and simultaneously forms a shared contact at a gate electrode.

Another advantage of present invention is that a bulky spacer is removed. This increases the process margin by having the spacer between the shared contact and the lightly doped drain region removed.

Another advantage of the present invention is that instances in which a source/drain region of a shared contact is not opened or narrowly opened by a spacer are restricted.

DETAILED DESCRIPTION

As has been mentioned, the invention provides a semiconductor device with shared contacts, as seen in FIG. 1. The invention also provides methods of manufacturing the same. The present invention will now be described more fully hereinafter with reference to the accompanying drawings, in which preferred embodiments of the invention are shown.

EMBODIMENT 1

Figure 5:
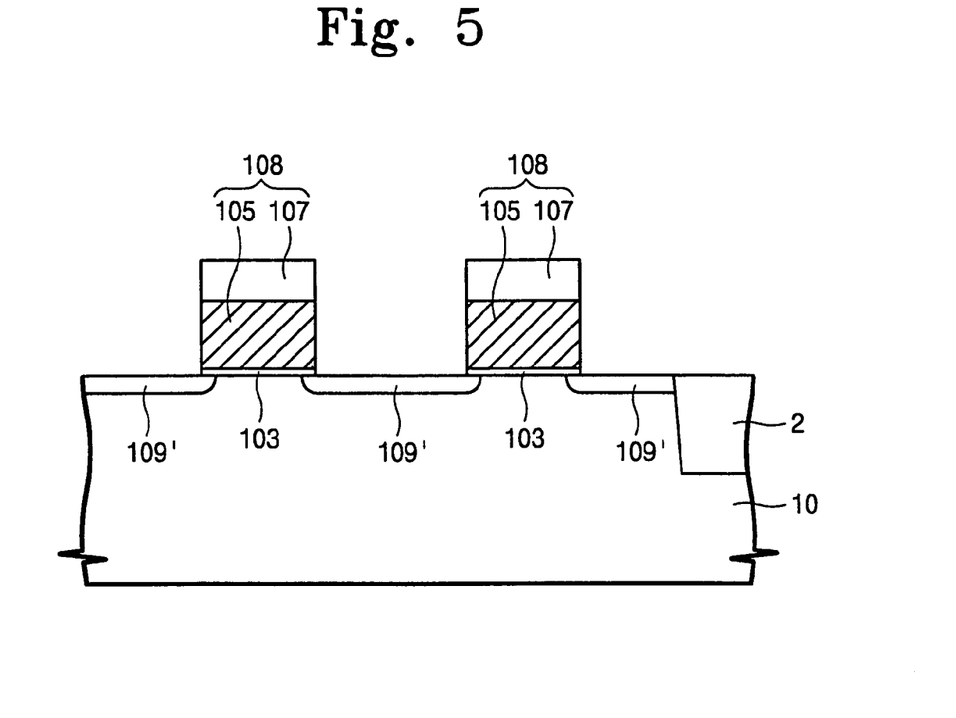
FIGS. 5 through 8 are cross-sectional views showing successive steps of making a LDD-type semiconductor device using a shared contact according to a method of the present invention.

Referring to FIG. 5, a starting point is shown for manufacturing a device according to the invention. A gate pattern 108 spaced from a semiconductor substrate 10 by a gate insulation layer 103 is formed. In forming the gate pattern 108, the gate insulation layer 103 of the substrate 10 may be removed at the sides of the gate pattern. The gate pattern 108 is composed of a dual layer formed by stacking a polysilicon layer 105 and a metal silicide layer 107. Through annealing to cure etch damage, a thin oxide layer (not illustrated) may be formed at the substrate 10 and the surface of the gate pattern 108. Using the gate pattern as an etch mask, impurity ions are implanted yielding a low-concentration source/drain region 109'. A sample implantation might be performed, for example, in a dose amount of $1 \times 10^{12}$ to $1 \times 10^{14}$ atoms/cm$^2$ by applying low energy of 10 KeV. As the concentration of the implanted impurity ions decreases, the depth of the source/drain region in the substrate decreases.

Figure 6:
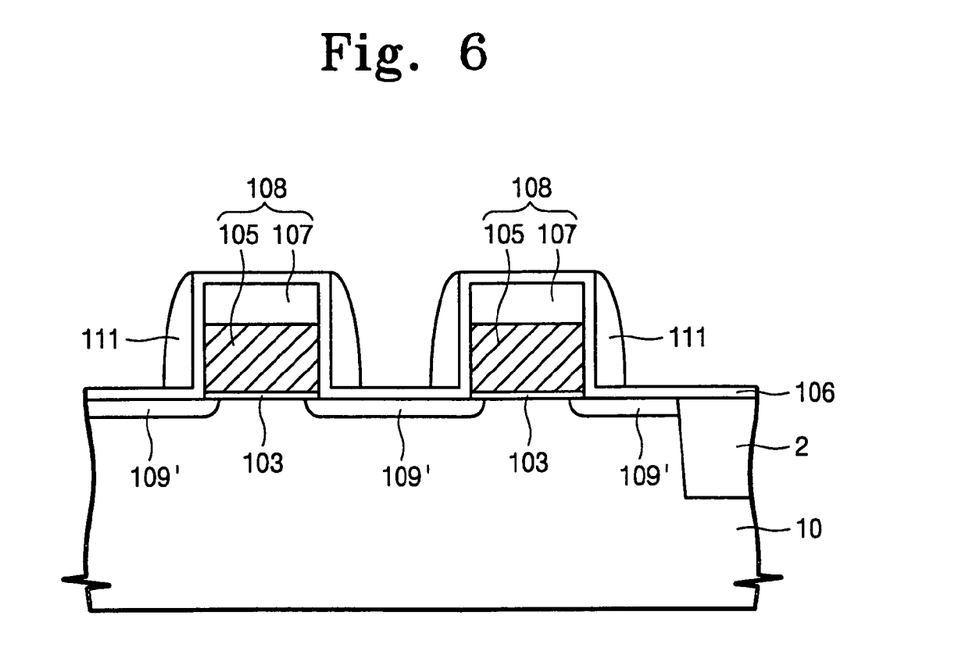

Referring to FIG. 6, a first spacer layer 106 of silicon nitride is formed over the substrate 10, covering the gate pattern 108 and the low-concentration source/drain region 109'. Next, a second spacer layer of silicon oxide is formed over the first spacer layer 106 and anisotropically etched to form a second spacer 111.

Figure 7:
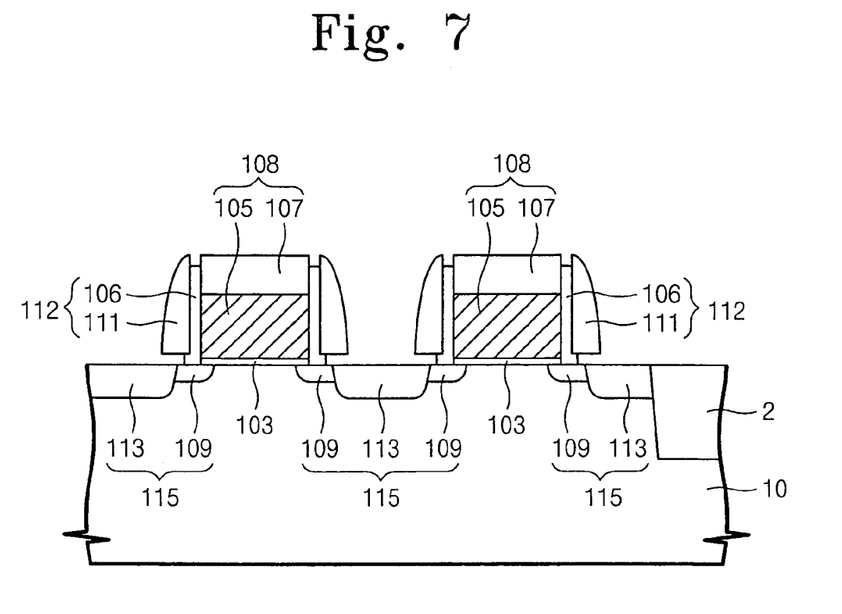

Referring to FIGS. 6 and 7, areas of the first spacer layer 106, exposed at the top surface of the gate pattern 108 and on the substrate 10 where the second spacer 111 is formed, are removed by an isotropic etching process using phosphoric acid, leaving a first spacer 106' only between the second spacer 111 and the sidewall of the gate pattern 108. Through the isotropic etching, the first spacer layer 106 between the second spacer 111 and the substrate is mostly removed. By using the gate pattern 108 and entire spacer 112, composed of the first and second spacers 106 and 111, as ion-implantation masks, impurity-ions are implanted. A sample implant might be performed, for example, in a high dose amount of $1 \times 10^{15}$ to $5 \times 10^{15}$ atoms/cm$^2$ and by applying energy of 40 KeV. This creates high-concentration source/drain regions 113 on the both sides of the gate pattern 108, thereby forming LDD-type source/drain regions 115. Regions 113 are spaced laterally from the gate pattern 108 a distance determined by the combined lateral thickness of spacers 112; i.e., a distance greater than the lateral thickness of spacer 106 alone.

Figure 8:
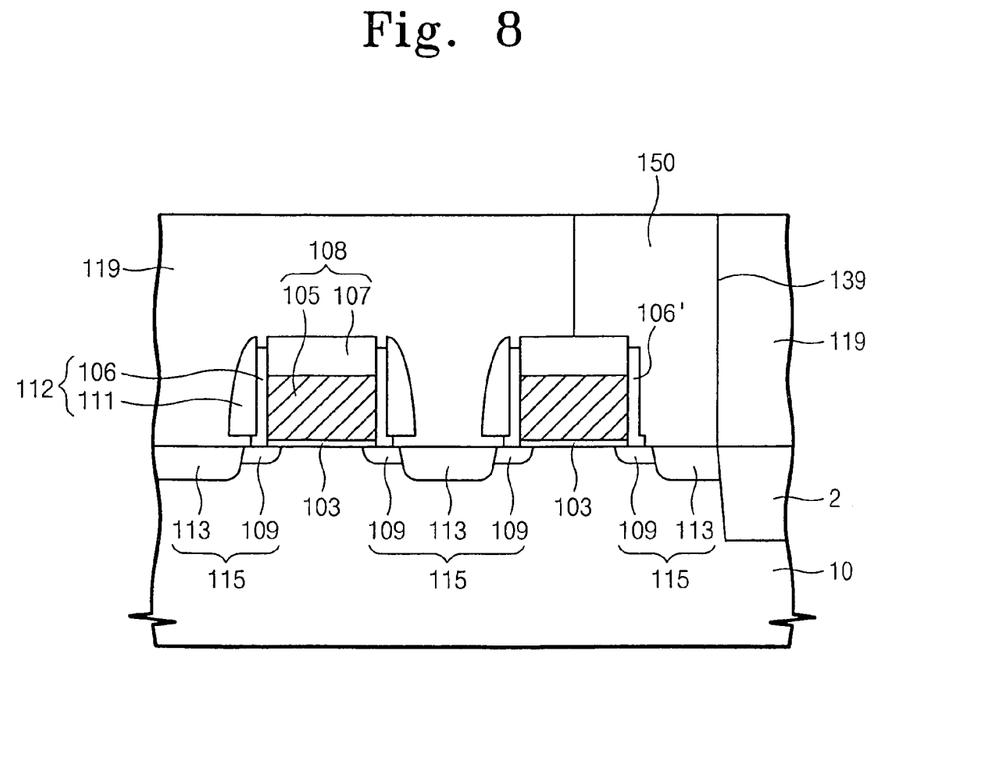

Referring to FIGS. 7 and 8, an interlayer insulation layer 119 of silicon oxide, such as an undoped silicate glass (USG), is stacked over the gate pattern 108 where the entire spacers 112 are formed. Additionally, the interlayer insulation layer 119 is patterned to form a shared contact hole 139 exposing the top surface of the gate pattern 108 and a part of the LDD-type source/drain regions 115 in the substrate 10 adjacent the gate pattern. The interlayer insulation layer 119 and the second spacer 111 are formed of silicon oxide, so that the second spacer 111 is removed and the LDD-type source/drain regions 115 are exposed on the side of the first spacer 106 when the contact hole 139 of the shared contact is formed. Therefore, the contact surface at which the contact plug and the source/drain region are contacted with each other is widened in comparison to techniques in the prior art. A conductive layer (not shown) fills the contact hole to form a contact plug 150. It will be observed that spacer 111 is not removed in the prior art. FIG. 8 displays a partial cross-section of the semiconductor device of the present invention. The remaining spacer 106' has a lateral thickness (width) less than the lateral spacing of adjoining highly doped drain region 113 and the width of lightly doped drain region 109.

EMBODIMENT 2

Figure 9:
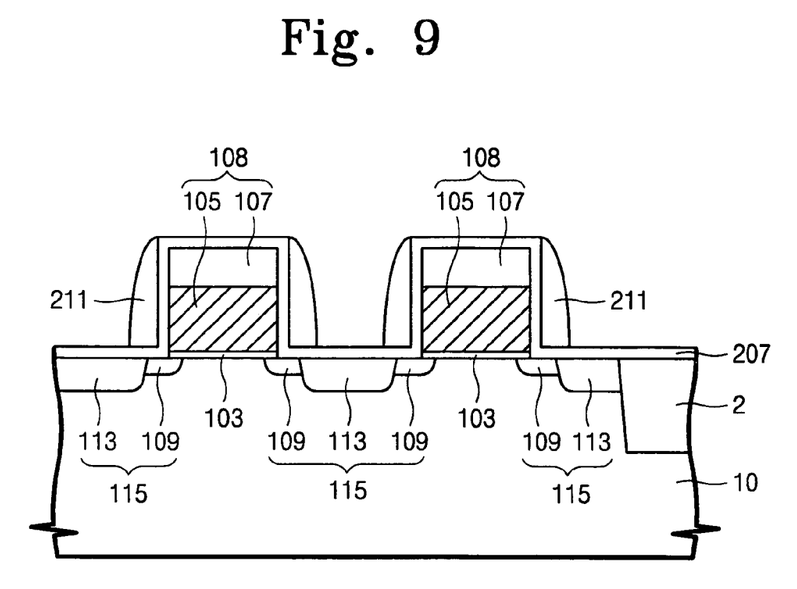
FIGS. 9 through 11 are cross-sectional views showing successive steps of making a LDD-type semiconductor device using a shared contact according to another method of the present invention.

Referring to FIG. 9, an etch-stopping layer 207 of silicon nitride is formed on the substrate 10 including over the gate pattern 108 and the low-concentration source/drain region 109. A spacer layer of silicon oxide is deposited over layer 207 and anisotropically etched to form a spacer 211. Impurity ions are implanted by using the spacer 211 and the gate pattern 108 as ion-implantation masks. A sample implant might be performed, for example, in a high dose amount of $1\times10^{15}$ to $5\times10^{15}$ atoms/cm2, by applying energy of approximately 60 KeV. This creates LDD-type source/drain regions 115 including a high-concentration source/drain region 113, on both sides of the gate pattern 108. Regions 113 are spaced laterally from the gate pattern 108 a distance determined by the combined lateral thickness of etch-stopping layer 207 and spacer 211; i.e., a distance greater than the lateral thickness of etch-stopping layer 207 alone.

Figure 10:
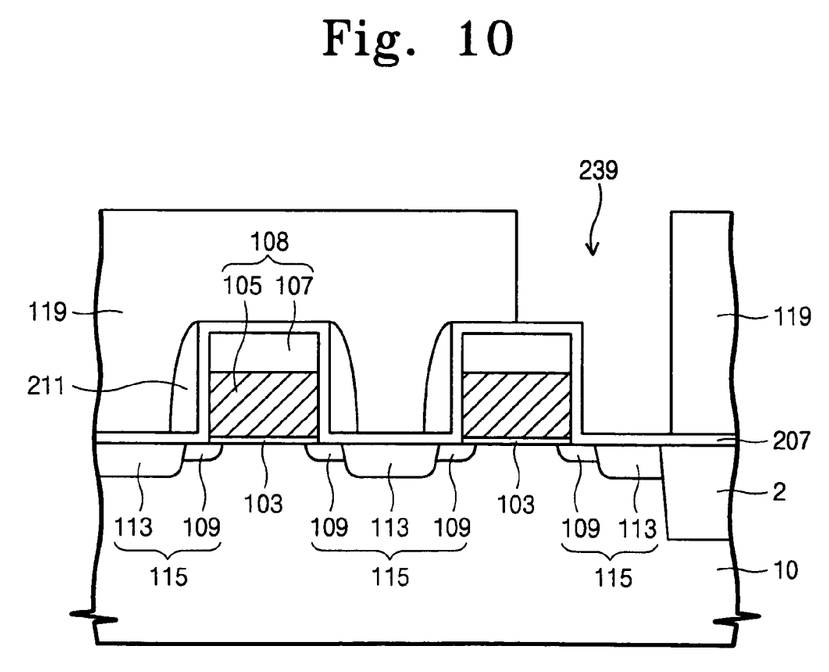

Referring to FIGS. 9 and 10, an interlayer insulation layer 119 of silicon oxide is deposited over the gate pattern 108 and the spacer 211. The interlayer insulation layer 119 is patterned and etched to form a shared contact hole 239 exposing parts of the gate pattern 108 and the LDD-type source/drain regions 115 of the neighboring substrate. Because the spacer 211 is formed of silicon oxide like the interlayer insulation layer 119, the spacer 211 is removed when the contact hole 239 is formed at the contact region. Even when a part of the contact region extends over the trench-type isolation layer 2 due to misalignment of the contact hole 239, the isolation layer 2 is not damaged since the etch-stopping layer 207 covers on the trench-type isolation layer 2.

Figure 11:
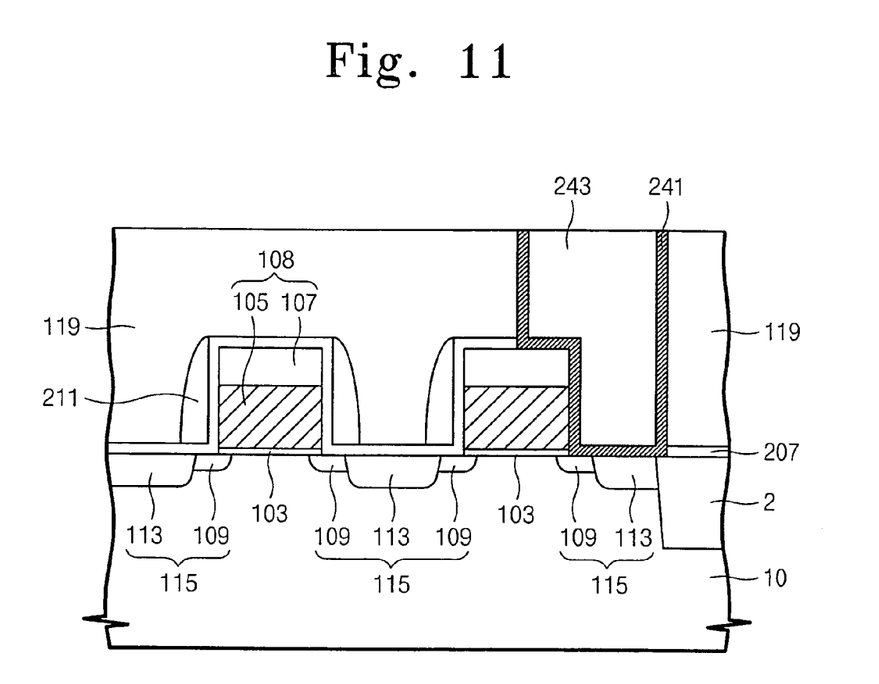

Referring to FIGS. 10 and 11, after the contact hole 239 is formed at the interlayer insulation layer 119, the etch-stopping layer 207 exposed in the contact region is removed by wet-etching. This exposes the top and side surfaces of the gate pattern 108 and containing the neighboring substrate the LDD-type source/drain regions 115. A barrier layer 241 of titanium/titanium nitride is shallowly deposited over the surfaces of contact hole 239, and the contact hole is filled with CVD tungsten. A planarization-etching process such as CMP is performed to leave a contact plug 243 in the contact hole. The contact plug 243 largely contacts the gate pattern 108 and the adjoining LDD-type source/drain region 115 of the substrate 10, reducing the contact resistance in comparison to existing techniques wherein the spacer remains. FIG. 11 illustrates a partial cross-section of the semiconductor device according to this embodiment of the present invention.

EMBODIMENT 3

Figure 12:
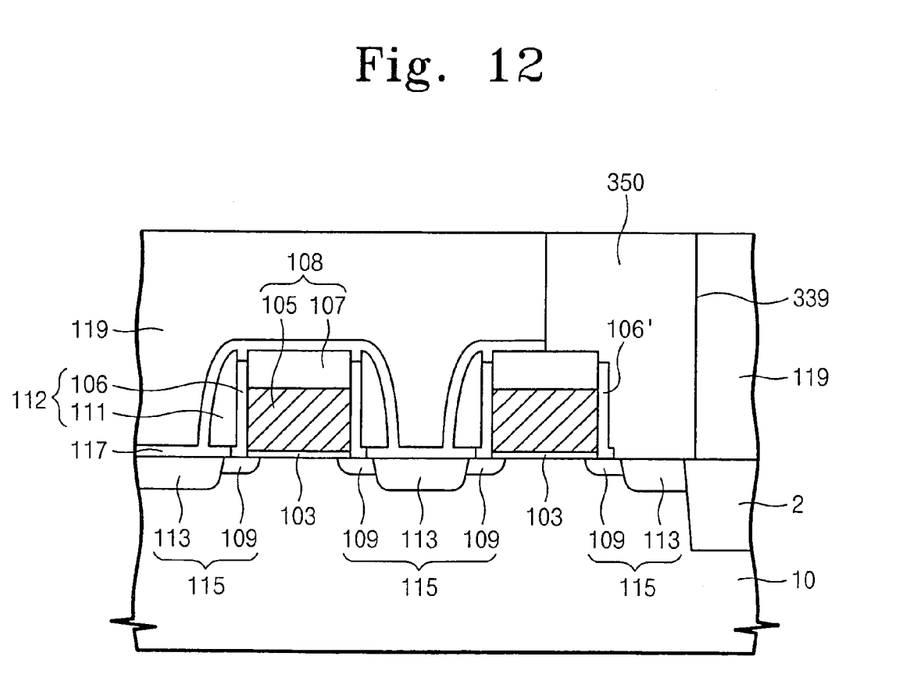
FIG. 12 is a cross-sectional view displaying another embodiment of a LDD-type semiconductor device using a shared contact of the present invention.

Referring to FIG. 12, an etch-stopping layer 117 of silicon nitride or silicon oxinitride (SiON) is formed. An interlayer insulation layer 119 of silicon oxide is deposited over the etch-stopping layer 117. The etch-stopping layer 117 is formed thinly at the top of the gate pattern 108 but thickly at the low part between the gate patterns 108 by employing a method such as HDP CVD. The interlayer insulation layer 119 and the etch-stopping layer 117 are patterned to form a shared contact hole 339 exposing part of the top surface of the gate pattern and the neighboring source/drain region. It is preferable to perform an anisotropic etching process which has a common etch selectivity with respect to the interlayer insulation layer 119 and the second spacer 111, a low etch selectivity with respect to the etch-stopping layer 117, and a tiny etch selectivity with respect to the metal silicide layer 107 of the top layer of the gate pattern 108. This removes the etch-stopping layer 117, the second spacer 111 and the interlayer insulation layer 119 at the contact region. The remnant etch-stopping layer 117 is then isotropically etched to expose the top surface of the gate pattern 108 and the LDD-type source/drain regions 115 at the contact region. During the anisotropic etching process, the first spacer 106 of silicon nitride may be removed according to the characteristic of an etchant. When a conductive layer fills the contact hole 339 to form a contact plug 350, the contact surface at which the contact plug contacts the LDD-type source/drain regions 115 is widened in comparison to existing techniques wherein the second spacer 111 is not removed.

After forming LDD-type source/drain regions, when a shared contact is formed at a part of the gate electrode and a neighboring source/drain region, the spacer is removed for formation of the lightly doped drain region, thereby increasing a process margin. Thus, it is possible to avoid instances where a source/drain region of a shared contact is not opened or is narrowly constricted by a spacer.

A person skilled in the art will be able to practice the present invention in view of the description present in this document, which is to be taken as a whole. Numerous details have been set forth in order to provide a more thorough understanding of the invention. In other instances, well-known features have not been described in detail in order not to obscure unnecessarily the invention. In addition, in the attached figures, the thickness of layers and regions may be exaggerated for clarity. Moreover, when it is mentioned that a layer is on another layer or on a substrate, the layer in question may be formed directly on another layer or on the substrate, or a third layer may be interposed there between.

While the invention has been disclosed in its preferred form, the specific embodiments as disclosed and illustrated herein are not to be considered in a limiting sense. Indeed, it should be readily apparent to those skilled in the art in view of the present description that the invention may be modified in numerous ways. The inventor regards the subject matter of the invention to include all combinations and subcombinations of the various elements, features, functions and/or properties disclosed herein.

The following claims define certain combinations and subcombinations, which are regarded as novel and non-obvious. Additional claims for other combinations and subcombinations of features, functions, elements and/or properties may be presented in this or a related document.

What is claimed is:

1. A method of forming a semiconductor device, comprising:
    forming at least one gate pattern on a substrate;
    forming a low-concentration source/drain region at a substrate located at both sides of the gate pattern through ion-implantation;
    forming a spacer having an etch selectivity with respect to the gate pattern at a side of the gate pattern;
    performing ion-implantation by using the gate pattern and the spacer as ion-implantation masks to form a high-concentration impurity ion-implantation region;
    forming an interlayer insulation layer over the gate pattern at whose sidewall the spacer is formed; and
    forming a shared contact hole exposing parts of the top surface of the gate pattern and LDD-type source/drain regions of the substrate adjacent to the gate pattern, and simultaneously etching and removing at least a portion of the spacer together with the interlayer insulation layer at the shared contact hole.

2. The method of claim 1, wherein the forming of the spacer further comprises:
    forming an inner spacer layer on the gate pattern, the inner spacer layer having a larger etch selectivity compared to the interlayer insulation layer;

forming an outer spacer layer on the inner spacer layer, the inner spacer layer having a smaller etch selectivity compared to the interlayer insulation layer;

forming an outer spacer through anisotropically etching the outer spacer layer; and forming an inner spacer between the outer spacer and the gate pattern sidewall through etching the inner spacer layer.

3. The method of claim 2, wherein the interlayer insulation layer and the outer spacer layer are formed of silicon oxide and the inner spacer layer is formed of silicon nitride.

4. The method of claim 1, wherein before forming the spacer, the method further comprises forming a non-conductive etch-stopping layer having a difference in etch selectivity with respect to the interlayer insulation layer over the gate pattern, and the forming of the shared contact hole further comprises removing the non-conductive etch-stopping layer through an etching process at the shared contact region.

5. The method of claim 1, further comprising, before forming the interlayer insulation layer, forming an etch-stopping layer over the gate pattern and the spacer, wherein the etch-stopping layer has a difference in etch selectivity with respect to the interlayer insulation layer, and the forming of the shared contact hole further comprises removing the etch-stopping layer through an etching process at the shared contact region.

6. The method of claim 2, wherein the removing of at least the portion of the spacer comprises removing the outer spacer.

* * * * *

UNITED STATES PATENT AND TRADEMARK OFFICE
CERTIFICATE OF CORRECTION

| | |
|---|---|
| PATENT NO. | : 7,064,026 B2 |
| APPLICATION NO. | : 11/143194 |
| DATED | : June 20, 2006 |
| INVENTOR(S) | : Kim et al. |

Page 1 of 1

It is certified that error appears in the above-identified patent and that said Letters Patent is hereby corrected as shown below:

At column 7, line 2, please replace "inner spacer layer" with --outer spacer layer--

Signed and Sealed this

Sixth Day of March, 2007

JON W. DUDAS
*Director of the United States Patent and Trademark Office*